(12) United States Patent
Canella

(10) Patent No.: US 7,120,999 B2
(45) Date of Patent: Oct. 17, 2006

(54) METHODS OF FORMING A CONTACT ARRAY IN SITU ON A SUBSTRATE

(75) Inventor: Robert L. Canella, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 10/668,925

(22) Filed: Sep. 23, 2003

(65) Prior Publication Data

US 2004/0058470 A1    Mar. 25, 2004

Related U.S. Application Data

(62) Division of application No. 09/941,853, filed on Aug. 29, 2001, now Pat. No. 7,049,693.

(51) Int. Cl.
  *H01R 9/00* (2006.01)
  *H01L 23/04* (2006.01)

(52) U.S. Cl. .......................... 29/842; 29/830; 29/854; 29/861; 29/874; 29/884; 275/698; 439/65

(58) Field of Classification Search ............... 29/622, 29/830, 857, 861, 875, 884, 842, 844, 846, 29/847, 854, 874; 174/250, 254, 261; 257/690, 257/723–727, 773–774, 698; 438/47, 612; 439/47, 612, 50, 55, 65; 482/121, 138, 142, 482/904

See application file for complete search history.

(56) References Cited

U.S. PATENT DOCUMENTS

| | | | |
|---|---|---|---|
| 3,275,736 A * | 9/1966 | Hotine et al. ............. 174/84 R |
| 3,569,790 A | 3/1971 | Jenik | |
| 3,573,617 A | 4/1971 | Randolph et al. | |
| 3,670,409 A | 6/1972 | Reimer | |
| 4,210,383 A | 7/1980 | Davis | |
| 4,713,611 A | 12/1987 | Solstad et al. | |
| 4,716,049 A | 12/1987 | Patraw | |
| 4,760,335 A | 7/1988 | Lindberg | |
| 4,774,632 A | 9/1988 | Neugebauer | |
| 4,878,846 A | 11/1989 | Schroeder | |
| 4,893,172 A | 1/1990 | Matsumoto et al. | |
| 4,902,606 A | 2/1990 | Patraw | |
| 4,924,353 A | 5/1990 | Patraw | |
| 4,933,808 A | 6/1990 | Horton et al. | |
| 4,950,173 A * | 8/1990 | Minemura et al. ............. 439/82 |
| 4,975,079 A | 12/1990 | Beaman et al. | |
| 5,006,792 A | 4/1991 | Malhi et al. | |
| 5,015,191 A | 5/1991 | Grabbe et al. | |
| 5,073,117 A | 12/1991 | Malhi et al. | |
| 5,086,337 A | 2/1992 | Noro et al. | |
| 5,097,101 A | 3/1992 | Trobough | |

(Continued)

*Primary Examiner*—Minh Trinh
*Assistant Examiner*—Donghai D. Nguyen
(74) *Attorney, Agent, or Firm*—TraskBritt, PC

(57) ABSTRACT

A substrate assembly is disclosed including a substrate and a plurality of spring-biased electrical contacts formed thereon for establishing electrical contact with the lead elements of an IC device. The substrate assembly also comprises a layer of resilient conductive material formed on a surface of the substrate, the spring-biased electrical contacts being formed in the resilient conductive material layer in situ on the substrate. Each spring-biased electrical contact includes a surface or surfaces configured to bias against and electrically contact an IC device lead element. The present invention also encompasses methods of fabricating substrate assemblies according to the invention, including heat treating the substrate assembly after formation to achieve desired spring characteristics.

17 Claims, 11 Drawing Sheets

U.S. PATENT DOCUMENTS

| | | |
|---|---|---|
| 5,139,427 A | 8/1992 | Boyd et al. |
| 5,144,747 A | 9/1992 | Eichelberger |
| 5,149,662 A | 9/1992 | Eichelberger |
| 5,152,695 A | 10/1992 | Grabbe et al. |
| 5,153,814 A | 10/1992 | Wessely |
| 5,173,055 A | 12/1992 | Grabbe |
| 5,175,491 A | 12/1992 | Ewers |
| 5,198,963 A | 3/1993 | Gupta et al. |
| 5,199,879 A | 4/1993 | Kohn et al. |
| 5,208,529 A | 5/1993 | Tsurishima et al. |
| 5,228,861 A | 7/1993 | Grabbe |
| 5,245,277 A | 9/1993 | Nguyen |
| 5,289,117 A | 2/1994 | Van Loan et al. |
| 5,321,277 A | 6/1994 | Sparks et al. |
| 5,329,423 A | 7/1994 | Scholz |
| 5,367,253 A | 11/1994 | Wood et al. |
| 5,376,010 A | 12/1994 | Petersen |
| 5,396,032 A | 3/1995 | Bonham, Jr. et al. |
| 5,400,220 A | 3/1995 | Swamy |
| 5,420,506 A | 5/1995 | Lin |
| 5,476,211 A | 12/1995 | Khandros |
| 5,477,086 A | 12/1995 | Rostoker et al. |
| 5,477,161 A | 12/1995 | Kardos et al. |
| 5,502,397 A | 3/1996 | Buchanan |
| 5,517,515 A | 5/1996 | Spall et al. |
| 5,545,050 A | 8/1996 | Sato et al. |
| 5,556,293 A | 9/1996 | Pfaff |
| 5,570,033 A | 10/1996 | Staab |
| 5,578,870 A | 11/1996 | Farnsworth et al. |
| 5,602,422 A | 2/1997 | Schueller et al. |
| 5,611,705 A | 3/1997 | Pfaff |
| 5,628,635 A | 5/1997 | Ikeya |
| 5,629,837 A | 5/1997 | Barabi et al. |
| 5,632,631 A | 5/1997 | Fjelstad et al. |
| 5,637,008 A | 6/1997 | Kozel |
| 5,646,447 A | 7/1997 | Ramsey et al. |
| 5,646,542 A | 7/1997 | Zamborelli et al. |
| 5,647,756 A | 7/1997 | Twigg et al. |
| 5,648,893 A | 7/1997 | Loo et al. |
| 5,655,926 A | 8/1997 | Moon |
| 5,656,945 A | 8/1997 | Cain |
| 5,669,774 A | 9/1997 | Grabbe |
| 5,686,843 A | 11/1997 | Beilstein, Jr. et al. |
| 5,691,041 A | 11/1997 | Frankeny et al. |
| 5,692,911 A | 12/1997 | Webster et al. |
| 5,702,255 A | 12/1997 | Murphy et al. |
| 5,727,954 A | 3/1998 | Kato et al. |
| 5,730,606 A | 3/1998 | Sinclair |
| 5,746,608 A | 5/1998 | Taylor |
| 5,751,554 A | 5/1998 | Williams et al. |
| 5,786,704 A | 7/1998 | Kim |
| 5,789,271 A | 8/1998 | Akram |
| 5,791,914 A | 8/1998 | Loranger et al. |
| 5,800,205 A | 9/1998 | Arakawa |
| 5,802,699 A | 9/1998 | Fjelstad et al. |
| 5,810,609 A | 9/1998 | Faraci et al. |
| 5,812,378 A | 9/1998 | Fjelstad et al. |
| 5,823,800 A | 10/1998 | Suehrcke et al. |
| 5,829,988 A | 11/1998 | McMillan et al. |
| 5,857,858 A | 1/1999 | Gorowitz et al. |
| 5,887,344 A | 3/1999 | Sinclair |
| 5,888,837 A | 3/1999 | Fillion et al. |
| 5,905,383 A | 5/1999 | Frisch |
| RE36,217 E | 6/1999 | Petersen |
| 5,923,181 A | 7/1999 | Beilstein, Jr. et al. |
| 5,934,914 A | 8/1999 | Fjelstad et al. |
| 5,944,537 A | 8/1999 | Smith et al. |
| 5,947,751 A | 9/1999 | Massingill |
| 5,955,888 A | 9/1999 | Frederickson et al. |
| 5,959,840 A | 9/1999 | Collins et al. |
| 5,973,340 A | 10/1999 | Mohsen |
| 5,973,394 A | 10/1999 | Slocum et al. |
| 5,978,223 A | 11/1999 | Hamilton et al. |
| 5,982,185 A | 11/1999 | Farnworth |
| 5,983,492 A | 11/1999 | Fjelstad |
| 5,984,694 A | 11/1999 | Sinclair |
| 6,002,590 A | 12/1999 | Farnworth et al. |
| 6,007,349 A | 12/1999 | Distefano et al. |
| 6,020,597 A | 2/2000 | Kwak |
| 6,036,503 A | 3/2000 | Tsuchida |
| 6,037,667 A | 3/2000 | Hembree et al. |
| 6,042,387 A | 3/2000 | Jonaidi |
| 6,043,563 A | 3/2000 | Eldridge et al. |
| 6,062,874 A | 5/2000 | Matsuda et al. |
| 6,174,174 B1 | 1/2001 | Suzuki et al. |
| 6,190,181 B1 | 2/2001 | Affolter et al. |
| 6,200,143 B1 | 3/2001 | Haba et al. |
| 6,229,320 B1 | 5/2001 | Haseyama et al. |
| 6,249,440 B1 | 6/2001 | Affolter |
| 6,333,638 B1 | 12/2001 | Fukasawa et al. |
| 6,374,487 B1 | 4/2002 | Haba et al. |
| 6,390,826 B1 | 5/2002 | Affolter et al. |
| 6,407,566 B1 | 6/2002 | Brunelle et al. |
| 6,409,521 B1 | 6/2002 | Rathburn |
| 6,428,328 B1 | 8/2002 | Haba et al. |
| 6,439,897 B1 | 8/2002 | Ikeya |
| 6,464,513 B1 | 10/2002 | Momenpour et al. |
| 6,471,524 B1 | 10/2002 | Nakano et al. |
| 6,503,089 B1 | 1/2003 | Saijo et al. |
| 6,512,388 B1 | 1/2003 | Satoh et al. |
| 6,549,418 B1 | 4/2003 | Deeney |
| 6,551,112 B1 | 4/2003 | Li et al. |
| 6,781,390 B1 | 8/2004 | Kazama |
| 6,821,129 B1 | 11/2004 | Tsuchiya |
| 2002/0016090 A1 | 2/2002 | Haba et al. |
| 2003/0042595 A1 | 3/2003 | Canella |

\* cited by examiner

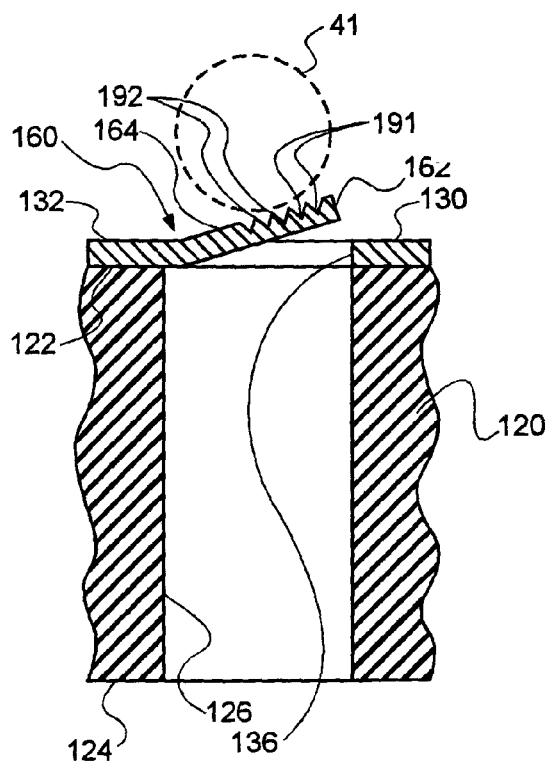
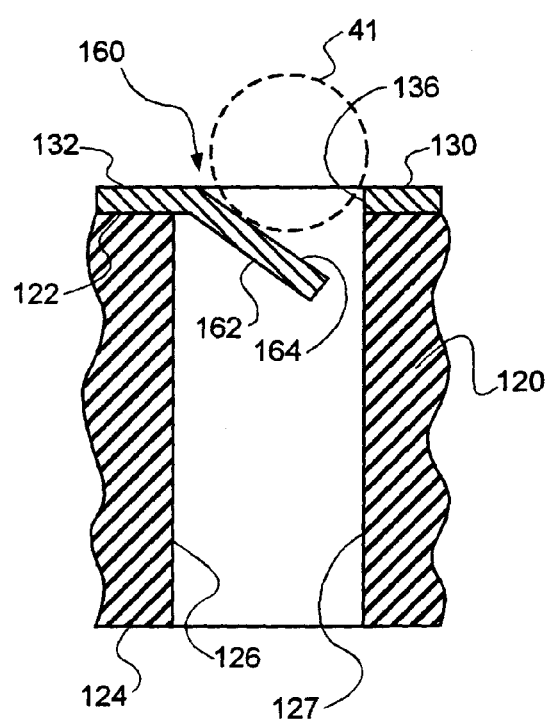
FIG. 6  FIG. 7
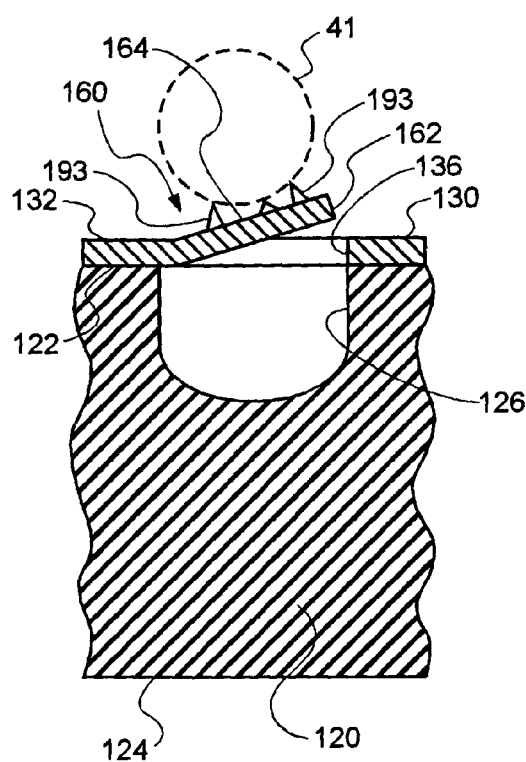
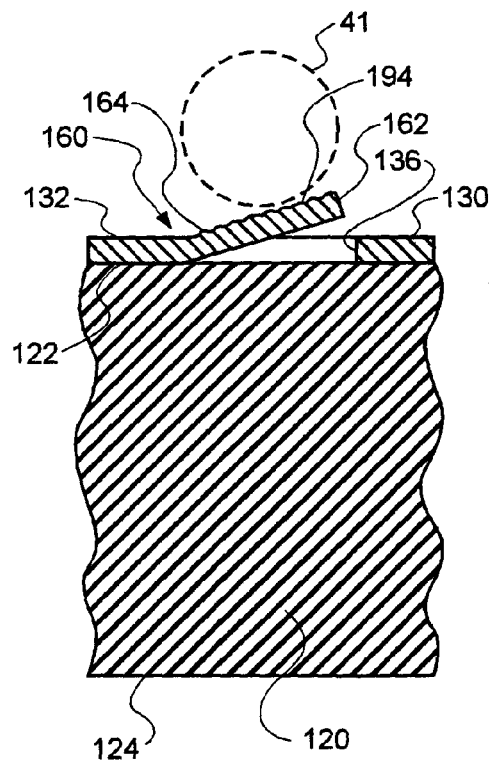
FIG. 8  FIG. 9

METHODS OF FORMING A CONTACT ARRAY IN SITU ON A SUBSTRATE

CROSS-REFERENCE TO RELATED APPLICATION

This application is a divisional of application Ser. No. 09/941,853, filed Aug. 29, 2001, now U.S. Pat. No. 7,049,693, issued May 23, 2006.

BACKGROUND OF THE INVENTION

1. Field of the Invention

The present invention relates generally to the assembly and testing of integrated circuit device components, such as multichip modules. Specifically, the present invention relates to a device and method for removably securing an integrated circuit device to a substrate and, in particular, to an array of spring-biased electrical contacts formed in a layer of resilient conductive material on a substrate and configured for establishing nonpermanent electrical connections between the lead elements of an integrated circuit device and the substrate.

2. State of the Art

Integrated circuit (IC) devices, such as Ball Grid Array (BGA) packages, Small Outline J-Lead (SOJ) packages, and Thin Small Outline Packages (TSOPs) are commonly assembled into multichip modules for connection to higher-level packaging, such as a motherboard or a personal computer chassis. Generally, a multichip module (MCM) includes a carrier substrate, such as a printed circuit board, having a plurality of IC devices mounted thereto. Other electrical components, such as resistors, capacitors, inductors, or other suitable devices, may also be mounted on the carrier substrate of the MCM or even on the IC devices. Electrical communication among the IC devices, between the IC devices and other electrical components on the multichip module, and between the devices and external components is established by conductors on the MCM carrier substrate. The conductors may be conductive traces fabricated on the surface of, or internal to, a printed circuit board. Methods for fabricating printed circuit boards having conductive traces, as well as other types of substrates having conductors thereon, are well-known in the art.

Conventional IC devices, such as BGA packages, SOJ packages, and TSOPs, generally comprise a semiconductor die electrically connected to a plurality of electrical leads that are encased within an encapsulant material, a portion of each of the electrical leads extending from the encapsulant material and configured for establishing electrical connections between the semiconductor die and external components or higher level packaging. By way of example, an exemplary embodiment of a conventional BGA package is shown in FIGS. 1 and 2. The conventional BGA package 10 includes a semiconductor die 20 secured to a die-attach pad 35 formed on an upper surface 31 of a substrate 30, which may also be termed an interposer. The BGA package 10 also includes a plurality of electrical leads 40 adapted to provide electrical communication between the semiconductor die 20 and one or more external components (not shown). The semiconductor die 20 and at least a portion of each electrical lead 40 may be encased by an encapsulant material 50. The conventional BGA package 10 may be a memory device, such as a DRAM chip, a processor, or any other integrated circuit device known in the art.

Each of the electrical leads 40 includes an external conductive ball (or bump, pillar, or other lead element) 41 configured for electrical connection to an external component. The conductive ball 41 may be secured to a conductive pad 42 formed on a lower surface 32 of the substrate 30. Each electrical lead 40 further comprises a conductive via 43 extending from the conductive pad 42 and through the substrate 30 to a conductive trace 44. The conductive trace 44 (only a few of which are shown in FIG. 1 for clarity) is formed on the upper surface 31 of the substrate 30 and provides an electrical path from the conductive via 43 to a bond end 45 located proximate the semiconductor die 20. A bond wire 46 attached to the bond end 45 of the conductive trace 44 and extending to the semiconductor die 20, where the bond wire 46 is attached to a bond pad thereon, electrically connects the electrical lead 40 to the semiconductor die 20. At least the bond wire 46 and the conductive trace 44 of each electrical lead 40 may be encased by the encapsulant material 50.

The conventional BGA package 10 may include a plurality of the conductive balls 41 arranged, for example, in an array or arrays of mutually adjacent rows and columns. Referring to FIG. 1, the conductive balls 41 may be arranged in two arrays 60, 70, each array 60, 70 disposed between an edge of the semiconductor die 20 and a peripheral edge of the substrate 30. Each array 60, 70 comprises three columns 61, 62, 63, 71, 72, 73, respectively, of conductive balls 41. The arrangement of conductive balls 41 is typically referred to as the "pin-out" or the "footprint" of the BGA package 10. Those of ordinary skill in the art will understand that the particular pin-out of the BGA package 10 may vary depending upon the application and that the pin-out may be of any suitable configuration.

To attach and electrically connect the conductive balls 41 of the BGA package 10 to a substrate (such as, for example, an MCM carrier substrate or a burn-in board), the substrate is configured with a plurality of contact pads arranged in a number of contact pad arrays. Each contact pad array includes a number of contact pads arranged in a pattern corresponding to the pinout of the BGA package 10. The conductive balls 41 of the BGA package 10 may be formed of solder or a conductive or conductor-filled epoxy. If solder, the conductive balls 41 are reflowed to connect to the contact pads of the contact pad array on the substrate. If epoxy, the conductive balls 41 may be first heated to a tacky "B" stage to adhere to the contact pads, and then further heated to completely cure the epoxy to a "C" stage. A substrate may include a plurality of IC devices mounted thereto, wherein each of the IC devices is permanently attached to a corresponding contact pad array on a surface of the substrate. By way of example, an MCM may be a memory module comprised of a carrier substrate having opposing surfaces, with one or both of the opposing surfaces of the carrier substrate including multiple contact pad arrays and a plurality of IC devices, such as BGA packages, SOJ packages, and/or TSOPs, mounted thereto.

During the fabrication of an IC device, the IC device may be subjected to individual component-level testing, such as burn-in and electrical testing. An IC device that exhibits a desired level of performance during component level testing is generally referred to as a "known good device" or "known good die" while an IC device failing to meet minimum performance characteristics may be referred to as a "known bad device." After component-level testing, the IC device may be assembled into higher level packaging, such as an MCM, and again subjected to testing. Testing of higher level packaging such as an MCM (referred to herein as module level testing) may include burn-in, electrical characterization and performance evaluation, as well as other desired electrical testing.

If an MCM fails to exhibit minimum operating characteristics during module level testing, an IC device causing the failure, which may have previously been identified as a "known good device" during component level testing, must be removed from the MCM and replaced. Also, it may be desirable to introduce a "known bad" IC device into an MCM for module level testing in order to observe the electrical characteristics of the MCM with the "known bad" IC device, or to observe the electrical characteristics of the "known bad" IC device at the module level. After module level testing is complete, the "known bad" IC device must be removed from the MCM and replaced. Thus, although individual IC devices are typically tested at the component level, it is desirable to subject IC devices to further testing at the module level, as a "known good device" may fail at the module level and, further, because incorporation of a "known bad device" into an MCM may be useful in module level testing.

To test IC devices in a higher level environment, module level testing is generally performed after the IC devices are assembled into and permanently attached to, for example, an MCM carrier substrate. Thus, if an IC device must be removed from an MCM after module level testing, the permanent electrical bonds between the electrical leads of the IC device, for example, the conductive balls 41 of the conventional BGA package 10, and the contact pads on the MCM carrier substrate must be severed. Severing the permanent electrical bonds, which typically comprise solder or conductive epoxy, may cause both heat-induced and mechanical damage to the MCM carrier substrate and conductors, to the electrical leads and electrical bonds of the IC devices remaining on the MCM, and to other electrical components mounted on the MCM.

Also, it may be necessary to remove an IC device from a substrate to achieve an upgrade. For example, as technological advances are made by IC device manufacturers, it is often desirable to replace an IC device mounted to a substrate with a next-generation IC device exhibiting improved performance characteristics. To replace an obsolete IC device mounted to a substrate, such as the carrier substrate of an MCM comprising part of, for example, a personal computer, the permanent electrical bonds between the electrical leads of the obsolete IC device and a plurality of contact pads on the substrate must be severed, which may cause both heat-induced and mechanical damage to the substrate and to other IC devices remaining on the substrate.

To prevent heat-induced and mechanical damage resulting from severing of the permanent electrical bonds between the electrical leads of an IC device and a plurality of contact pads on a substrate, the IC device may be nonpermanently attached to the substrate for module level testing, as well as for final assembly. Use of nonpermanent connections between the electrical leads of an IC device and a contact pad array of a substrate allows for easy removal of the IC device after module level testing or after final assembly without any resulting damage from the severing of permanent electrical bonds. Sockets and fixtures for nonpermanently attaching an IC device to a substrate are well-known in the art; however, such sockets can be relatively expensive and their cost often does not justify their use. Although the cost of conventional sockets and fixtures may, in some instances, be acceptable for limited use applications, such as testing and small production runs, their cost is generally not acceptable for full scale production.

Use of nonpermanent electrical connections between the electrical leads of an IC device and a contact pad array of a substrate can, however, itself cause problems during module level testing and/or at final assembly. Non-planarities in the substrate, in the conductors forming a contact pad array, or in the IC device itself, may, in the absence of a permanent bonding agent, result in poor electrical contact between an electrical lead of the IC device and a corresponding contact pad on the substrate. For example, nonplanarities in the substrate 30 of the BGA package 10, as well as inconsistency in size of the conductive balls 41, may result in unreliable electrical contact between the conductive balls 41 and the contact pads of a substrate in the absence of a permanent bonding agent. Similarly, for other types of IC devices, such as the SOJ package or the TSOP, deflection of their electrical leads as they come into contact with the contact pads on the substrate may, again in the absence of a permanent bonding agent such as solder or conductive epoxy, result in poor electrical contact. Poor electrical contact resulting from nonplanarities and/or lead deflections may produce unreliable test data during module level testing or prohibit the acquisition of any meaningful test data and such poor electrical contact may result in nonfunctional, assembled IC device components.

Therefore, a need exists in the art for a low-cost device and method of forming nonpermanent, reliable electrical connections between the electrical leads of an IC device and a contact pad array of a substrate. Such an apparatus and method must also provide for robust, compliant and reliable electrical connections between the electrical leads of an IC device and the contact pads on a substrate.

BRIEF SUMMARY OF THE INVENTION

The present invention comprises embodiments of a substrate assembly including a plurality of spring-biased electrical contacts for establishing electrical contact with the lead elements extending from an IC device. The substrate assembly comprises a substrate having an upper surface and an opposing lower surface, and the substrate assembly further comprises a layer of resilient conductive material disposed proximate at least one of the upper and lower surfaces of the substrate. The layer of resilient conductive material comprises any suitable conductive material that also exhibits elastic properties suitable for the formation of the spring-biased electrical contacts and, further, the resilient conductive material layer may be formed on the substrate using any suitable deposition process or may be a separately formed laminate bonded to a surface of the substrate.

A plurality of electrically isolated conductive traces are formed in the layer of conductive material. At least some of the conductive traces each terminate at a spring-biased electrical contact also formed in the resilient conductive material layer. Each spring-biased electrical contact is electrically isolated from the layer of resilient conductive material layer by an aperture formed in the resilient conductive material layer.

A spring-biased electrical contact includes a surface or surfaces configured to bias against and establish both physical and electrical contact with a lead element of an IC device, and the spring-biased electrical contact may also be configured to align the IC device lead element relative thereto. The spring-biased electrical contact may be configured as, for example, a cantilevered spring, a transversely deflecting hoop-shaped spring, a spiral-shaped spring, or a rosette spring. A via formed in the substrate and opening onto at least one of its surfaces may underlie a spring-biased electrical contact, providing a recess into which the spring-biased electrical contact can deflect upon engagement with an IC device lead element. Also, a spring-biased electrical contact may be preformed with a permanent deflection towards or away from the underlying substrate surface, in which case a subjacent via may be eliminated. A spring-biased electrical contact may further include one or more contact elements configured to wipe away or puncture through oxides and other contaminants on the exterior surface of an IC device lead element. Further, the substrate assembly may include a layer of dielectric material overlying the layer of resilient conductive material and having apertures therethrough substantially aligned with the spring-biased electrical contacts. The overlying dielectric layer may be of sufficient thickness so that the apertures therethrough assist with alignment of conductive balls or bumps of an IC device to be mounted to the substrate assembly in a flip chip configuration.

A plurality of IC devices may be mounted to a substrate assembly according to the invention to form a multichip module. The IC devices may be mounted to either one or both of the surfaces of a substrate of the substrate assembly. The substrate may include a plurality of spring-biased electrical contacts arranged in one or more two-dimensional arrays, each array corresponding to the pinout of an IC device to be mounted thereon. A clamping element may be used to secure an IC device to the substrate and to bias the lead elements of the IC device against the spring-biased electrical contacts.

The present invention also encompasses methods of manufacturing a substrate assembly according to the invention. One embodiment of such a method includes the acts of providing a substrate, forming a layer of resilient conductive material on a surface of the substrate, followed by forming conductive traces, spring-biased electrical contacts, and apertures in the resilient conductive material layer and further including heat treating the substrate assembly. Subjecting the substrate assembly to a heat treatment after formation enables the realization of desired mechanical properties for the spring-biased electrical contacts while also providing for suitable mechanical properties in the resilient conductive material layer during formation of the conductive traces, spring-biased electrical contacts, and apertures.

In another embodiment of a method of manufacturing a substrate assembly according to the invention, the method further includes the act of forming vias in the substrate. A further embodiment of a method of manufacturing a substrate assembly according to the invention comprises the additional act of preforming one or more of the spring-biased electrical contacts. Yet another embodiment of a method of manufacturing a substrate assembly according to the invention includes the act of forming contact elements on one or more of the spring-biased electrical contacts.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

FIG. 6 shows a cross-sectional view of a portion of the substrate assembly of FIGS. 3 through 5, including an embodiment of a spring-biased electrical contact;

FIG. 7 shows a cross-sectional view of a portion of the substrate assembly of FIGS. 3 through 5, including an alternative embodiment of a spring-biased electrical contact;

FIG. 8 shows a cross-sectional view of a portion of the substrate assembly of FIGS. 3 through 5, including another alternative embodiment of a spring-biased electrical contact;

FIG. 9 shows a cross-sectional view of a portion of the substrate assembly of FIGS. 3 through 5, including a further alternative embodiment of a spring-biased electrical contact;

DETAILED DESCRIPTION OF THE INVENTION

Figure 1:
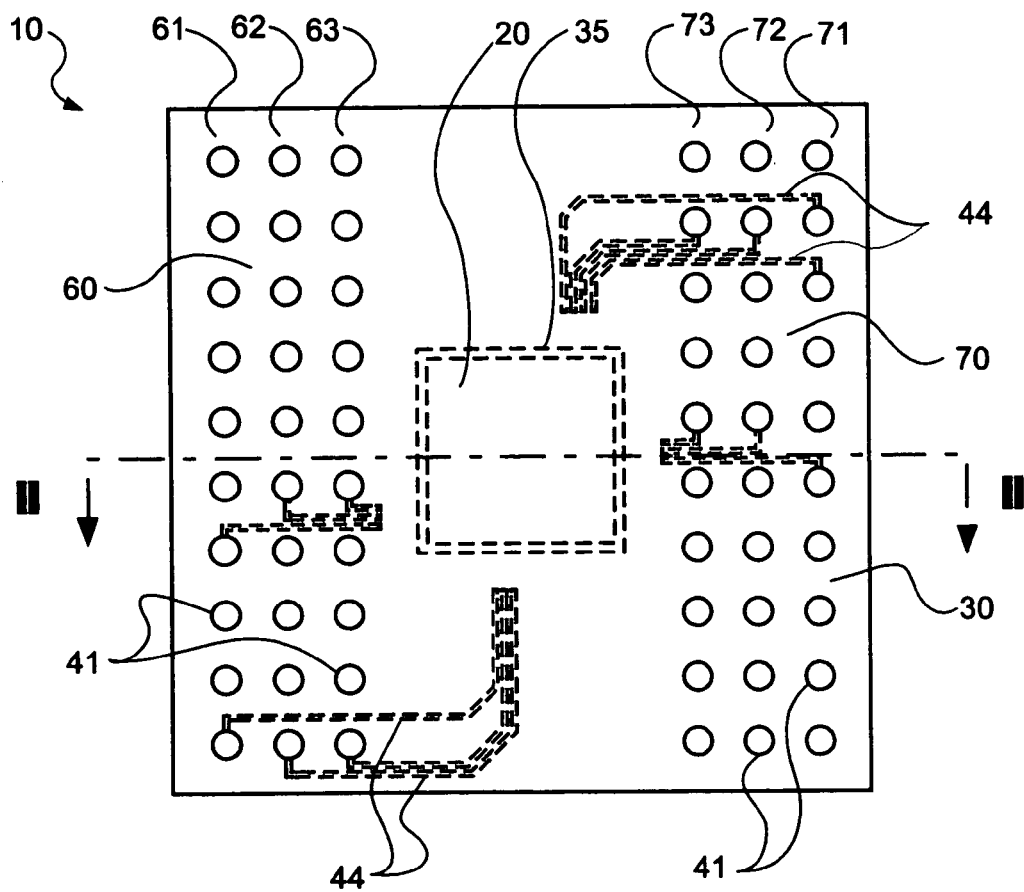
FIG. 1 shows a plan view of an exemplary embodiment of a conventional BGA package.
Figure 2:
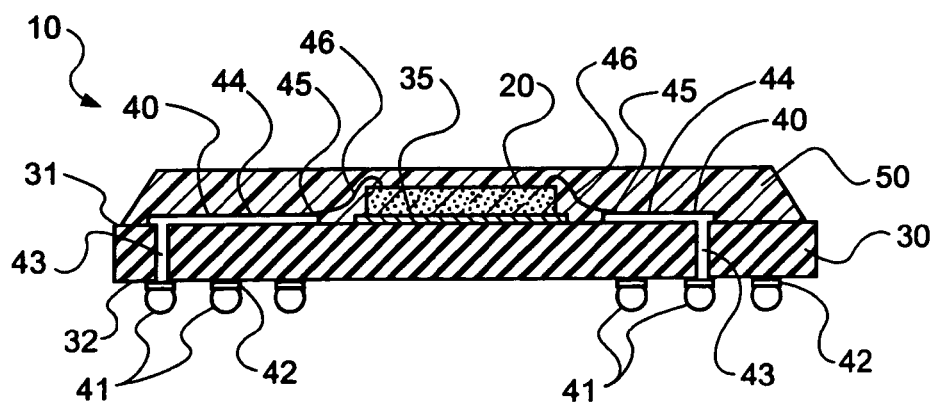
FIG. 2 shows a cross-sectional view of the conventional BGA package as taken along line II—II of FIG. 1.

Shown in FIGS. 3 through 6 is an embodiment of a substrate and a plurality of electrical contacts according to the present invention for establishing electrical contact with the lead elements of an IC device, such as the conventional BGA package 10 shown in FIGS. 1 and 2. The embodiments of a substrate and electrical contacts, or substrate assembly, of the present invention are described herein in the context of mounting and establishing electrical connections with a BGA package 10; however, those of ordinary skill in the art will understand that the substrate assembly of the instant invention may be used with other types of IC devices, such as, for example, an SOJ package or a TSOP. As used herein, the term "lead element" refers to and encompasses any type conductive ball, pillar, or bump extending from an IC device, as well as a lead finger extending from an IC device having leadframe construction, such as, for example, a TSOP or SOJ package.

Figure 3:
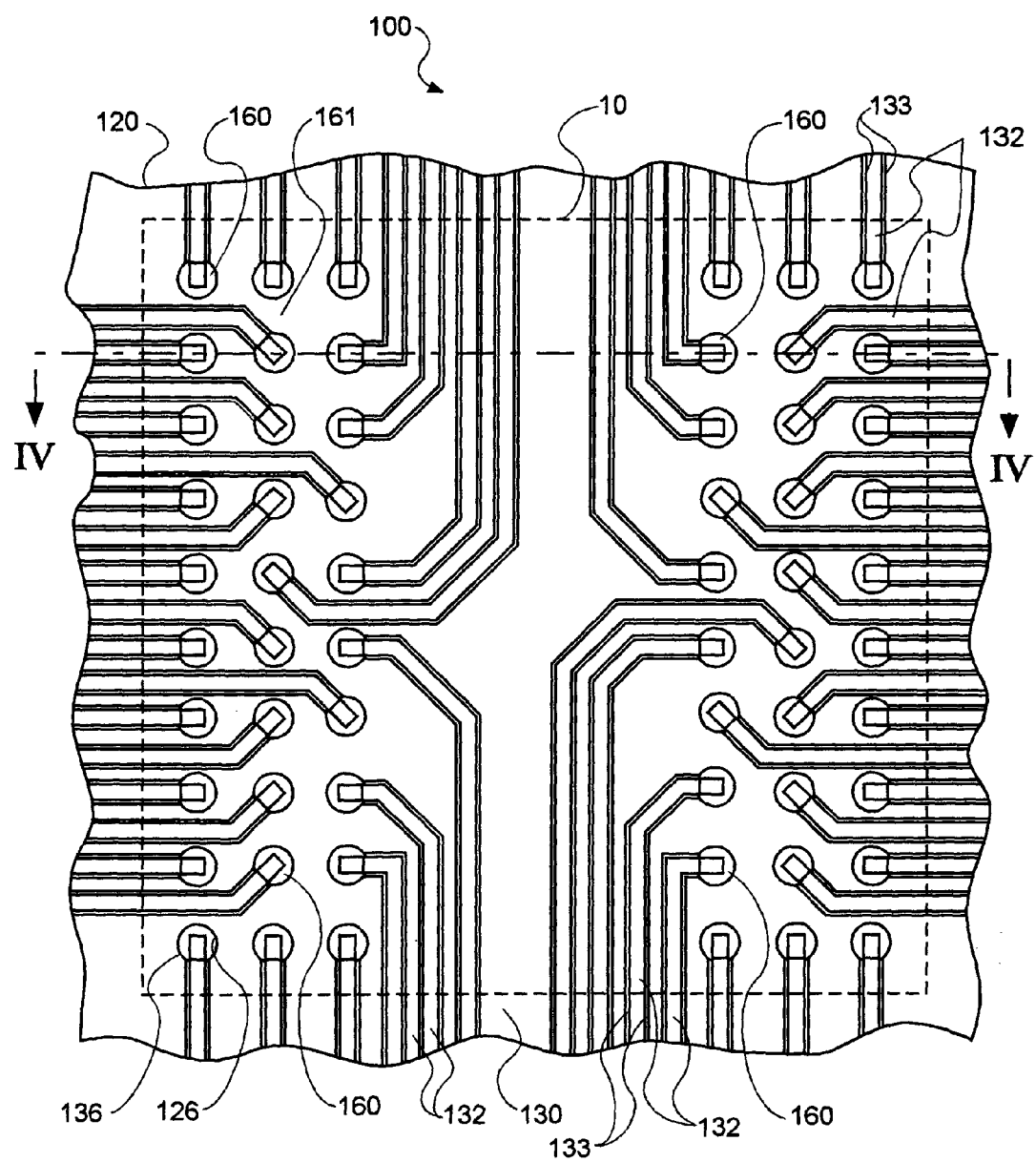
FIG. 3 shows a plan view of a substrate assembly according to the present invention.
Figure 4:
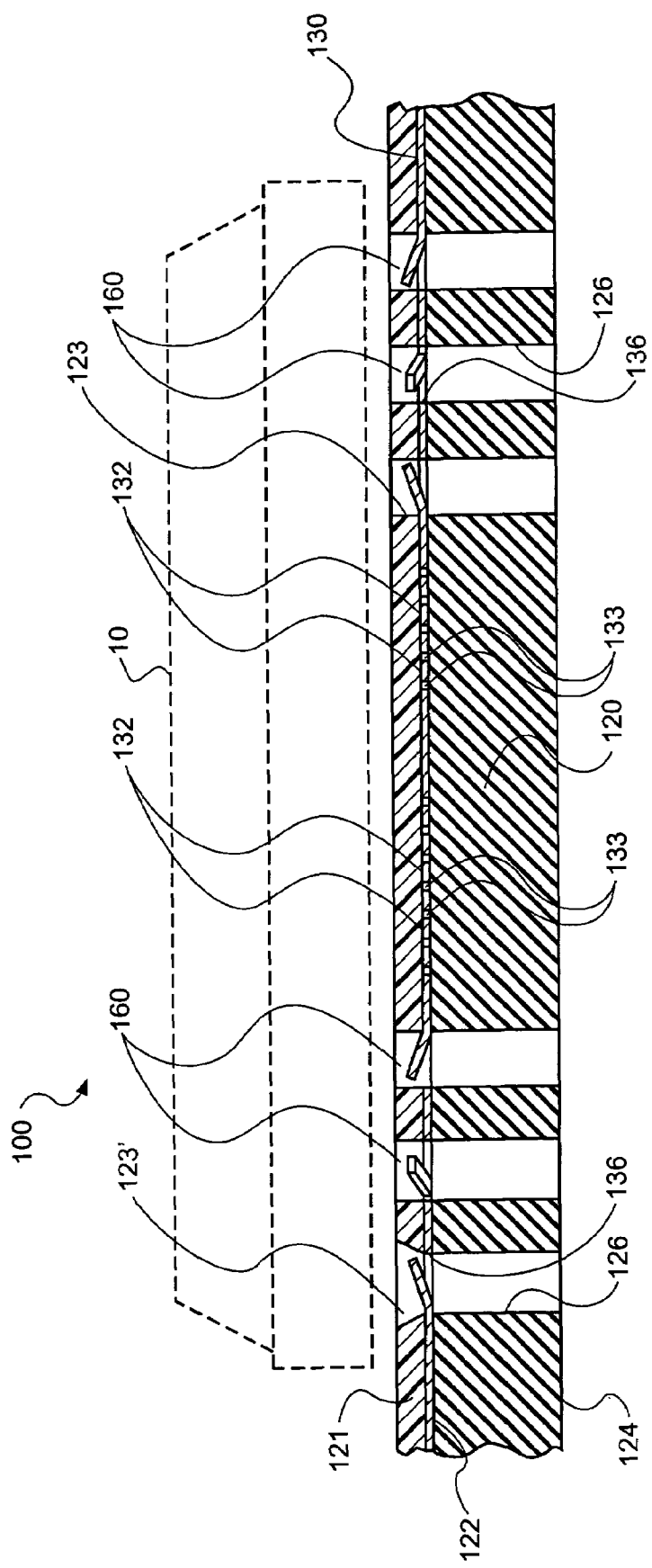
FIG. 4 shows a cross-sectional view of the substrate assembly according to the invention as taken along line IV—IV of FIG. 3.

Referring to FIGS. 3, 4, and 6, a substrate assembly 100 comprises a substrate 120 including an upper surface 122 and an opposing lower surface 124. The substrate 120 may comprise an MCM carrier substrate and, further, may be constructed of a printed circuit board (PCB) material, such as FR-4, according to conventional, well-known PCB fabrication techniques. However, the substrate 120 may be adapted to other, alternative applications, such as a burn-in board or other test board. Also, the substrate 120 may be constructed of any other suitable dielectric or nonconducting materials known in the art, including plastics, resins, composites, glasses, ceramics, and other oxide materials. Those of ordinary skill in the art will appreciate that the labels "upper" surface 122 and "lower" surface 124 are arbitrary and that either of the surface 122, 124 of the substrate 120 may be referred to as the upper surface. Further, the substrate surfaces 122, 124 may alternatively be referred to as simply the first and second surfaces.

The substrate assembly 100 further comprises a layer of resilient conductive material 130 formed on at least the upper surface 122 of the substrate 120 or a suitable portion thereof. The layer of resilient conductive material 130 comprises any suitable conductive material that also exhibits elastic properties suitable for the formation of spring-biased electrical contacts, as will be described in greater detail below. By way of example, the layer of resilient conductive material 130 may comprise a copper alloy material, such as beryllium copper. The layer of resilient conductive material 130 may be formed on the substrate 120 using any suitable process. For example, the layer of resilient conductive material 130 may be formed on the upper surface 122 of the substrate 120 using a sputtering process, a chemical vapor deposition (CVD) process, or any other suitable deposition process known in the art. Alternatively, the layer of resilient conductive material 130 may be a separately formed laminate that is subsequently secured to, or laminated on, the upper surface 122 of the substrate 120 using, for example, an adhesive and/or a thermocompression bonding process.

Referring to FIGS. 3 and 4, the layer of resilient conductive material 130 includes a plurality of conductive traces 132 formed therein, at least some of the conductive traces 132 each terminating at a spring-biased electrical contact 160. Each conductive trace 132 is formed by removing a portion of the layer of resilient conductive material 130 to form cavities 133, which cavities 133 define the conductive trace 132 and electrically isolate the conductive trace 132 from all other conductive traces 132 (as well as from other spring-biased electrical contacts 160) formed on the substrate 120. The cavities 133 extend through the layer of resilient conductive material 130 at least to the upper surface 122 of the substrate 120, and the cavities 133 may extend a depth into the substrate 120. Any suitable process known in the art, such as chemical etching or laser ablation, may be used to form the conductive traces 132 and cavities 133.

As noted above, at least some of the conductive traces 132 each terminate at a spring-biased electrical contact 160. Referring to FIGS. 3 through 6, each spring-biased electrical contact 160 comprises, for example, a cantilevered spring 162 formed in the layer of resilient conductive material 130 and configured to bias against and form electrical contact with a conductive ball 41 of the BGA package 10 or other lead element. The cantilevered spring 162 includes an upper surface 164 for making physical and electrical contact with the conductive ball 41 (shown in dashed line in FIG. 6). An aperture 136 formed in the layer of resilient conductive material 130 around the cantilevered spring 162 separates and electrically isolates the cantilevered spring 162 from the remainder of the layer of resilient conductive material 130. The spring-biased electrical contacts 160 and surrounding apertures 136 may also be formed using a chemical etching or laser ablation process, and the shapes of the spring-biased electrical contacts 160 and apertures 136 may also be cut or formed using a stamping process.

Figure 5:
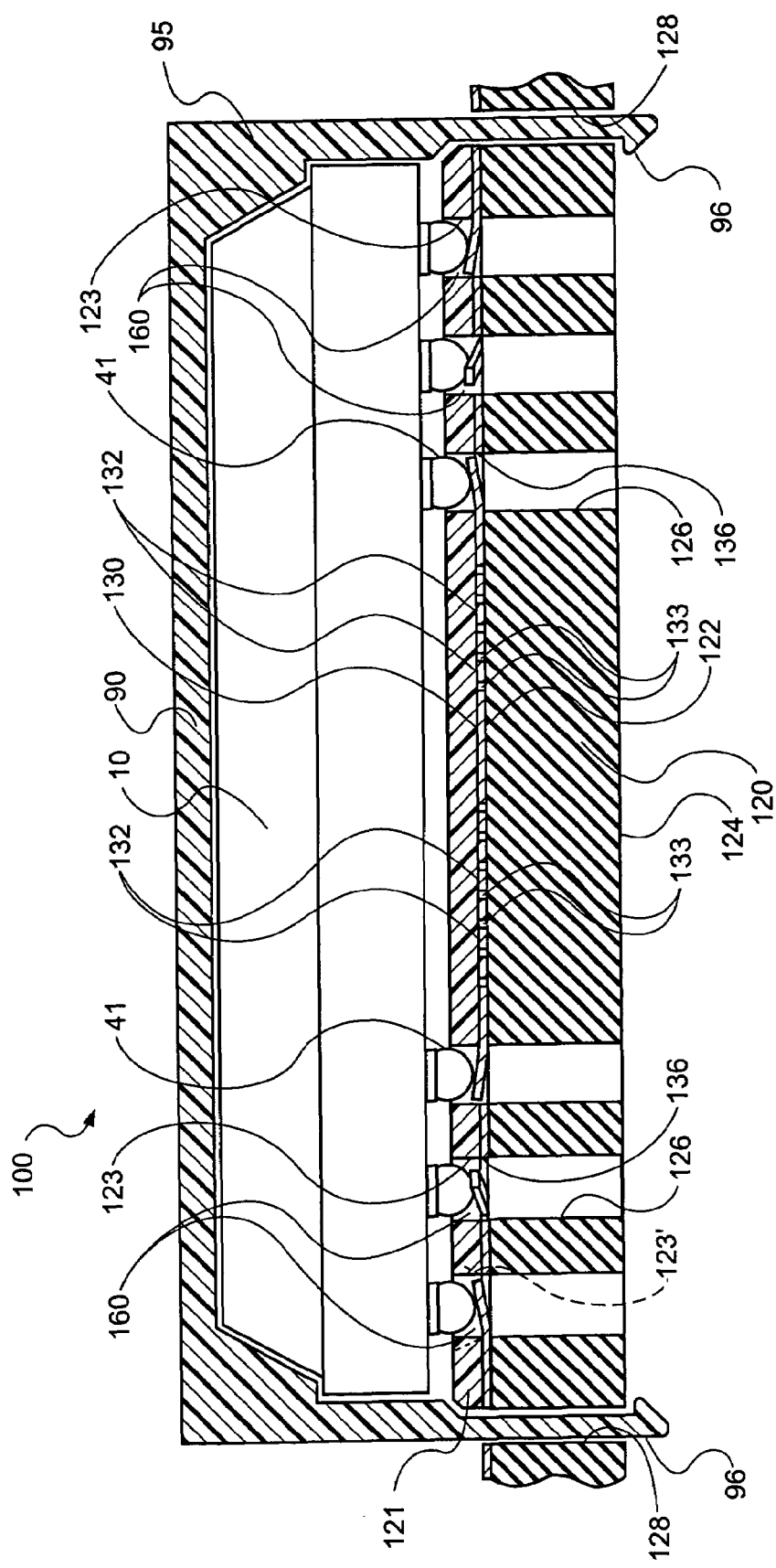
FIG. 5 shows a cross-sectional view of the substrate assembly according to the invention as taken along line IV—IV of FIG. 3 and further including a conventional BGA package as shown in FIGS. 1 and 2.

It should be noted that the layer of resilient conductive material 130 may be sandwiched between a lower dielectric layer of substrate 120 and an upper dielectric layer thereof which overlies layer of resilient conductive material 130, the upper dielectric layer defining upper surface 122. Referring to FIGS. 4 and 5 of the drawings, an exemplary overlying dielectric or insulative layer 121 having apertures 123 therein substantially aligned with apertures 136 may be disposed over the layer of resilient conductive material 130 after formation of the conductive traces 132 and spring-biased electrical contacts 160. The apertures in overlying dielectric layer 121 may be sized and configured to receive portions of conductive balls 41 of a BGA package (see FIG. 5 and description below) therein, and overlying dielectric layer 121 may be of sufficient thickness to assist with alignment of conductive balls 41 with spring-biased electrical contacts 160. If desired, apertures 123 may be of frustoconical shape as shown by aperture 123' with a wider upper portion to assist in the initial alignment of conductive balls 41.

Figure 4A:
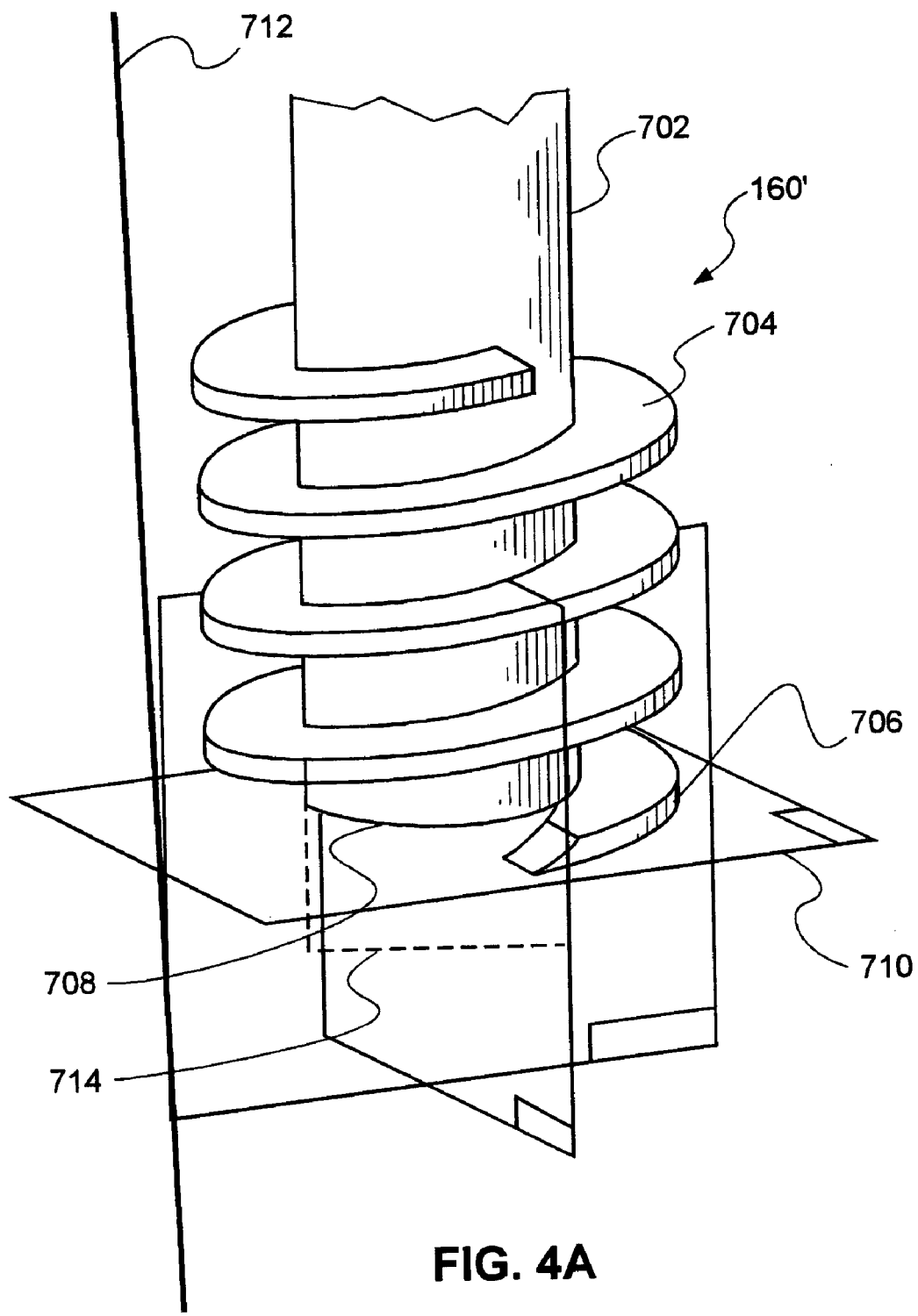
FIG. 4A shows a typical tool used to form the spring-biased electrical contacts on the substrate assembly.

Referring to FIG. 4A, a cutting tool 160' is illustrated that is used to form the spring-biased electrical contacts 160. The cutting tool 160' comprises a generally cylindrical body or shaft portion 702 terminating in a substantially flat end 708 substantially located in a plane 710 which is located with respect to a vertical axis, such as 712, the body or shaft portion 702 having a helical cutting spiral 704 attached to and/or formed thereon. The helical cutting spiral 704 terminates in a cutting face 706 located at the bottom end of the spiral 704 in substantially the same plane 710 as the end 708 of the body or shaft portion 702. The helical cutting spiral 704 may be formed at any suitable helical angle on the body or shaft portion 702 depending upon the amount of desired rotation of the cutting tool 160' to be used to form a spring-biased electrical contact 160. If desired, the end 708 of the cutting tool 160' may protrude beyond plane 710 in any suitable shape (illustrated in a dashed line 714) to be used as a pilot when engaged in a via 126 (FIGS. 3 and 4) of substrate 120 for the forming of the spring-biased electrical contact 160. The cutting face 706 of the helical cutting spiral 704 may be any suitable shape capable of forming the desired shape of the spring-biased electrical contact 160. For example, the cutting face 706 may be concave shaped, convex shaped, a combination of concave and convex shaped, etc. To form the spring-biased electrical contact 160, the cutting tool 160' is placed upon on the precursor structure of the spring-biased electrical contact 160, such as illustrated in FIG. 3 when the precursor structure of spring-biased electrical contact 160 is a layer on the substrate 120, and the cutting tool 160' subsequently rotated a desired amount for cutting face 706 to cut through a portion or the entirety of the precursor structure (layer) to form a length of resilient material and cause a portion thereof to be bent upwardly along the helical cutting spiral 704. Thereafter, the cutting tool 160' is rotated in the opposite direction to remove the cutting tool 160' from the formed spring-biased electrical contact 160.

The substrate 120 may include a via 126 formed therethrough substantially concentric with each aperture 136 formed in the resilient conductive layer 130. A via 126 extending through the substrate 120 provides a recess into which a corresponding spring-biased electrical contact 160, such as cantilevered spring 162, can deflect upon contact with a conductive ball 41 of the BGA package 10. The via 126 may also provide a port through which a tool may be inserted to push outwardly on the cantilevered spring 162 to permanently deflect the cantilevered spring 162 away from the upper surface 122 of the substrate 120 (see FIG. 6). Permanently deflecting, or preforming, the cantilevered spring 162, such that the cantilevered spring 162 is initially deflected away from the substrate 120 in an unbiased state, can increase the total deflection of the cantilevered spring 162 upon contact with a conductive ball 41, thereby increasing the force exerted by the cantilevered spring 162 against the conductive ball 41 and improving the electrical contact therebetween.

Referring to FIGS. 3, 4, and 5, the substrate 120 may include a plurality of spring-biased electrical contacts 160 arranged in a two-dimensional array 161 corresponding to the pin-out of the BGA package 10, the vias 126 extending through the substrate 120 also being arranged in a two-dimensional array corresponding to the pin-out of the BGA package 10. With reference to FIG. 5, a BGA package 10 having a plurality of conductive balls 41 may then be nonpermanently mounted to the substrate assembly 100, the two-dimensional array 161 of spring-biased electrical contacts 160 on substrate 120 establishing nonpermanent electrical connections with the conductive balls 41, respectively, of the BGA package 10. Thus, each conductive ball 41 of the BGA package 10 is engaged with and in electrical contact with a corresponding spring-biased electrical contact 160, such as a cantilevered spring 162, formed on the upper surface 122 of the substrate 120.

A clamping element 90 may be used to secure the BGA package 10 to the substrate 120 and to bias the conductive balls 41 thereof against the spring-biased electrical contacts 160 formed in the resilient conductive layer 130. The clamping element 90 may be any suitable clip or clamp known in the art adapted to secure the BGA package 10 to the substrate 120. For example, the clamping element 90 may comprise a stab-in-place clip 95 having one or more resilient tabs or prongs 96 configured for insertion into corresponding holes 128 in the substrate 120. The resilient tab or tabs 96 are retained by the mating hole or holes 128 to secure the BGA package 10 to the substrate 120 and to bias the conductive balls 41 thereof against the spring-biased electrical contacts 160. Typically, such stab-in-place type clips are injection molded from plastic materials and are relatively inexpensive. In addition to the foregoing, it is also contemplated that various apparatus disclosed and claimed in copending U.S. patent application Ser. No. 09/478,619, filed Jan. 5, 2000 and assigned to the assignee of the present invention may be employed to secure BGA package 10 to the substrate 120. The disclosure of U.S. patent application Ser. No. 09/478,619 is hereby incorporated herein by reference.

In an alternative embodiment, as shown in FIG. 7, a spring-biased electrical contact 160 comprises a cantilevered spring 162 that is not permanently deflected outwardly away from the upper surface 122 of the substrate 120 but, rather, that is preformed with a permanent deflection into its mating via 126 in the substrate 120. Use of such an inwardly deflected cantilevered spring 162 may facilitate alignment with a mating conductive ball 41 (shown in dashed line in FIG. 7) of the BGA package 10. Specifically, the inwardly deflected cantilevered spring 162 functions to guide the conductive ball 41 toward the wall 127 of the via 126, thereby essentially pinching the conductive ball 41 between the cantilevered spring 162 and the wall 127 of the via 126. In a further embodiment, although not shown in the figures, a spring-biased electrical contact 160 may comprise a generally planar cantilevered spring 162 that has no permanent deflection and that is essentially parallel with the upper surface 122 of the substrate 120.

In another alternative embodiment, as shown in FIG. 8, the cantilevered spring 162 is suspended over a via 126 that opens only to the upper surface 122 of the substrate 120. The via 126 extends into the substrate 120 a depth sufficient only to provide a relief into which the cantilevered spring 162, or the spring-biased electrical contact 160 generally, can deflect upon contact with a conductive ball 41 (shown in dashed line in FIG. 8) of the BGA device 10. In a further alternative embodiment, as shown in FIG. 9, the cantilevered spring 162, or the spring-biased electrical contact 160 generally, is positioned directly over the upper surface 122 of the substrate 120 and no corresponding via is provided subjacent the cantilevered spring 162. In the embodiment of FIG. 9, the cantilevered spring 162 is preformed with a permanent deflection outwardly away from the upper surface 122 of the substrate 120, such that the cantilevered spring 162 can deflect downward upon engagement with a conductive ball 41 (shown in dashed line if FIG. 9) of the BGA package 10.

In another embodiment of the present invention, the spring-biased electrical contact 160 includes one or more contact elements configured to wipe away and/or puncture through a layer of oxide and/or other contaminants formed on an exterior surface of a conductive ball 41. For example, referring to FIG. 6, the cantilevered spring 162 includes a plurality of grooves 191 formed into the upper surface 164 thereof and separated by ridges 192. Impingement of the ridges 192 of the cantilevered spring 162 against the outer surface of a conductive ball 41, in conjunction with relative motion therebetween, will cause the ridges to wipe or scrape against the exterior surface of the conductive ball 41 and to remove oxides and other contaminants therefrom. The grooves 191 and ridges 192 may be formed on a spring-biased electrical contact 160 using any suitable cleaving or cutting process, and the grooves 191 and ridges 192 may also be formed using a stamping process.

Alternatively, contact elements may comprise one or more barbs or protrusions formed on a spring-biased electrical contact 160 and extending therefrom. For example, referring to FIG. 8, a cantilevered spring 162 may include a plurality of barbs or protrusions 193 formed on an upper surface 164 thereof and extending generally upwards away from the upper surface 164. The barbs or protrusions 193 can impinge against and puncture through layers of oxide and other contaminants on the exterior surface of a conductive ball 41 to form electrical contact therewith. The barbs or protrusions 193 may be formed using any suitable deposition process, as noted above. Alternatively, a barb or protrusion 193 may be formed by puncturing a hole through, for example, a cantilevered spring 162 and subsequently pushing (or pulling) a portion of the cantilevered spring 162 around the periphery of the hole upwardly to form a barb or protrusion 193.

Also, a contact element may simply comprise a roughened surface formed on a spring-biased electrical contact 160. Referring to FIG. 9, a cantilevered spring 162 has an upper surface 164 including at least a roughened portion 194. The roughened portion 194 of the upper surface 164 can impinge against and move over the exterior surface of a conductive ball 41 to remove (by a scraping or wiping action) oxides and other contaminants therefrom.

Figure 10:
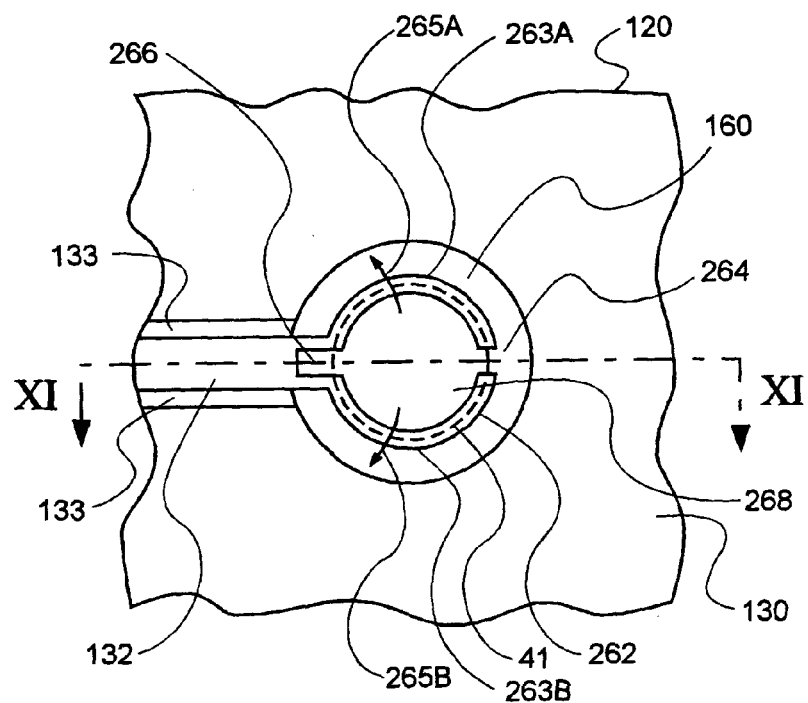
FIG. 10 shows a plan view of a substrate and a spring-biased electrical contact according to yet another alternative embodiment of the invention.
Figure 11:
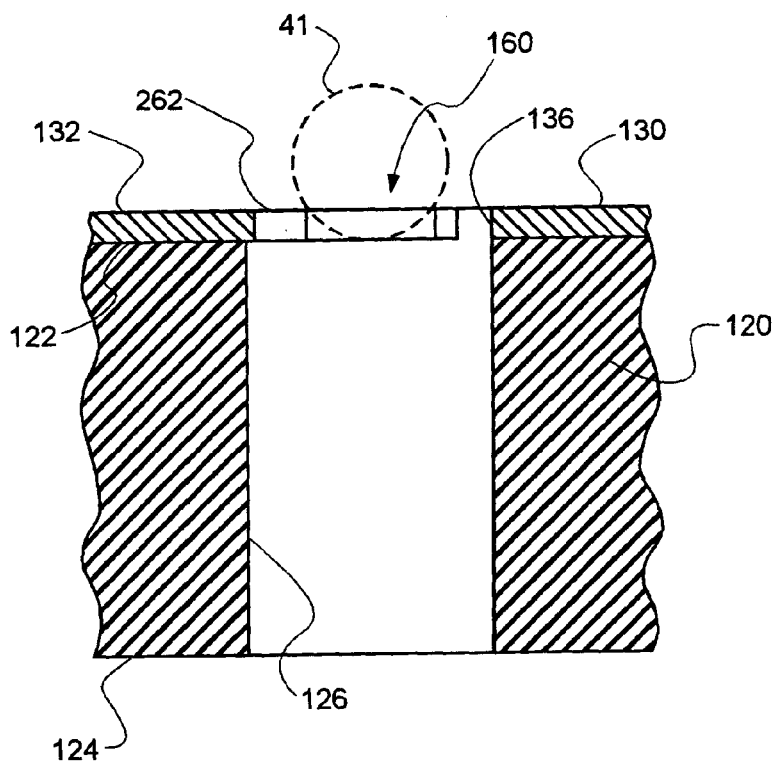
FIG. 11 shows a cross-sectional view of the substrate and spring-biased electrical contact as taken along line XI—XI of FIG. 10.

A spring-biased electrical contact 160 may comprise alternative shapes or configurations other than the cantilevered spring 162 shown and described with respect to FIGS. 3 through 9. For example, with reference to FIGS. 10 and 11, a spring-biased electrical contact 160 may comprise a transversely deflecting, hoop-shaped spring 262 formed in the layer of resilient conductive material 130. The hoop-shaped spring 262 comprises two semicircular arms 263a, 263b formed within an aperture 136 in the resilient conductive layer 130 and suspended over a via 126 formed in the substrate 120, the respective ends of the semicircular arms 263a, 263b being separated by a gap 264. The semicircular arms 263a, 263b are configured, upon engagement with a conductive ball 41 (shown in dashed line in FIGS. 10 and 11) of the BGA package 10, to transversely deflect in the plane of the layer of resilient conductive material 130 (as shown by arrows 265a, 265b). A notch 266 located intermediate of the semicircular arms 263a, 263b may facilitate deflection thereof, respectively. Further, the hoop-shaped spring 262 may also deflect downwardly into the via 126 in a manner similar to the cantilevered spring 162.

Thus, the forces exerted by the semicircular arms 263a, 263b as each deflects transversely outward (in directions 265a, 265b, respectively) upon engagement with a conductive ball 41, in conjunction with, optionally, deflection of the semicircular arms 263a, 263b downwardly into the via 126, form physical and electrical contact between the hoop-shaped spring 262 and the conductive ball 41. In addition, the shape of the hoop-shaped spring 262 itself (i.e., the hollow center portion 268) may facilitate alignment between the hoop-shaped spring 262 and the conductive ball 41. Further, impingement of the semicircular arms 263a, 263b against the exterior surface of the conductive ball 41 in conjunction with relative motion therebetween may result in the scraping of oxides and other contaminants from the exterior surface of the conductive ball 41. To enhance the removal of oxides and contaminants from the exterior surface of the conductive ball 41, the hoop-shaped spring 262 may include a plurality of grooves 191 and ridges 192 (see FIG. 6), a plurality of barbs or protrusions 193 (see FIG. 8), and/or a roughened surface portion 194 (see FIG. 9) formed on its exterior surface or a portion thereof.

The hoop-shaped spring 262 may also be used in conjunction with a via 126 that opens only to the upper surface 122 of the substrate 120 (see FIG. 8). Also, at least a portion of the hoop-shaped spring 262 may be preformed with a permanent upward deflection, enabling the hoop-shaped spring 262 to be positioned directly over the upper surface 122 of the substrate 120 with no via subjacent thereto (see FIG. 9). A preformed, hoop-shaped spring 262 having a permanent upward deflection may increase the deflection (downward toward the upper surface 122 of the substrate 120) of the hoop-shaped spring 262 upon engagement with a conductive ball 41, thereby increasing the corresponding biasing forces exerted on the conductive ball 41 and enhancing electrical contact therewith.

Figure 12:
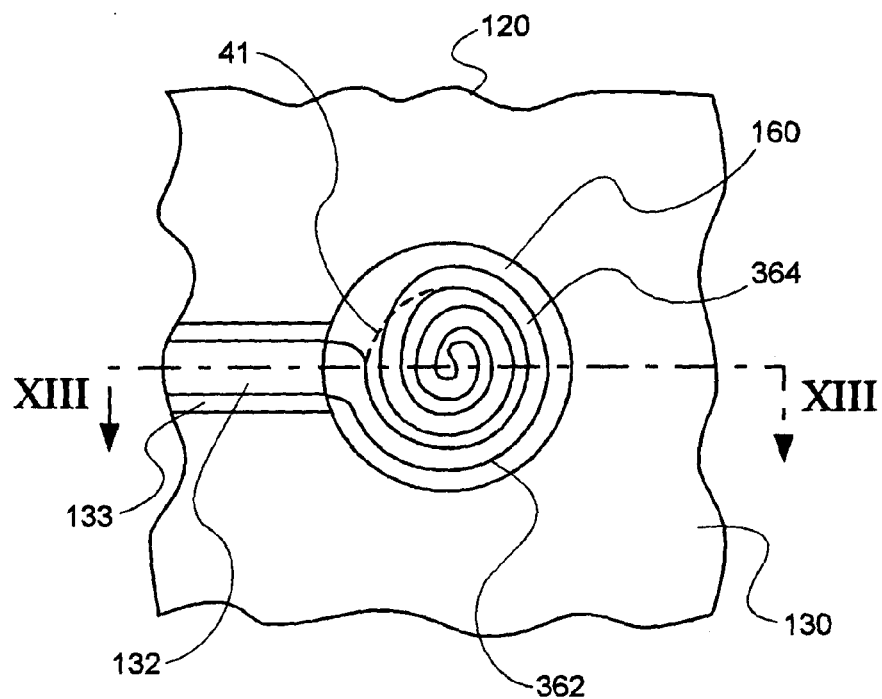
FIG. 12 shows a plan view of a substrate and a spring-biased electrical contact according to yet a further alternative embodiment of the invention.
Figure 13:
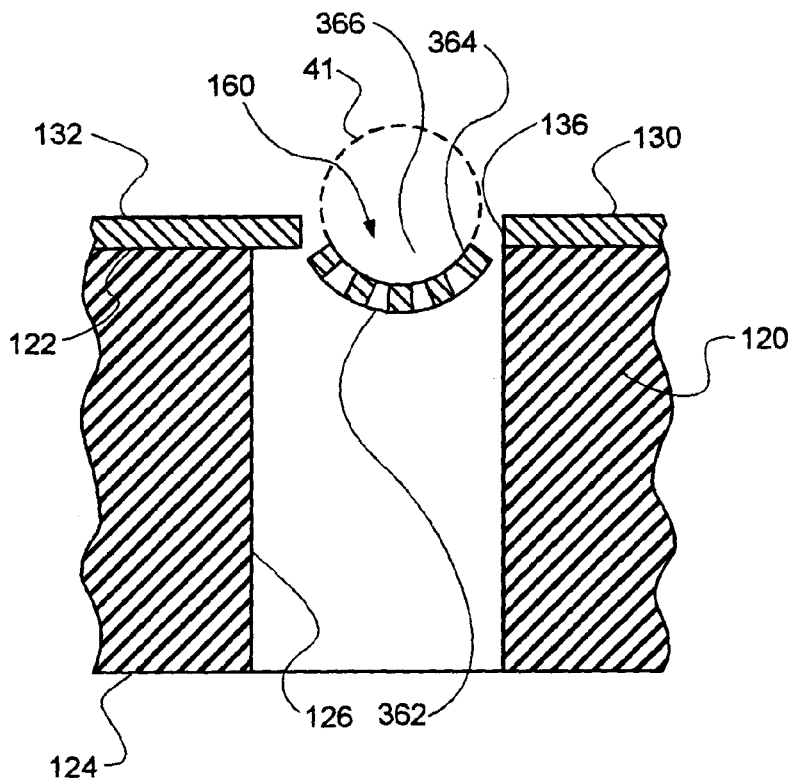
FIG. 13 shows a cross-sectional view of the substrate and spring-biased electrical contact as taken along line XIII—XIII of FIG. 12.

In another embodiment of the present invention, a spring-biased electrical contact 160 comprises a spiral-shaped spring 362, as shown in FIGS. 12 and 13. The spiral-shaped spring 362 is formed in the layer of resilient conductive material 130 within an aperture 136, and the spiral-shaped spring 362 extends from a conductive trace 132 and over a via 126 formed in the substrate 120. The spiral-shaped spring 362 includes an upper surface 364 for making physical and electrical contact with a conductive ball 41 (shown in dashed line in FIGS. 12 and 13) of the BGA package 10. Upon engagement with a conductive ball 41 of the BGA package 10, at least a portion of the spiral-shaped spring 362 will deflect downwardly into the via 126, thereby exerting a biasing force against the conductive ball 41 and establishing physical and electrical contact therewith. Also, as shown in FIG. 13, during engagement with the conductive ball 41 and deflection downwardly into the via 126, the spiral-shaped spring 362 may be configured to form a cup or recess 366 for receiving the conductive ball 41 and aligning the conductive ball 41 relative to the spiral-shaped spring 362.

To facilitate the removal of oxides and contaminants from the exterior surface of the conductive ball 41, the spiral-shaped spring 362 may include a plurality of grooves 191 and ridges 192 (see FIG. 6), a plurality of barbs or protrusions 193 (see FIG. 8), and/or a roughened surface portion 194 (see FIG. 9) formed on its upper surface 364 or a portion thereof. Also, the spiral-shaped spring 362 may be used in conjunction with a via 126 that opens only to the upper surface 122 of the substrate 120 (see FIG. 8). Further, at least a portion of the spiral-shaped spring 362 may be permanently deflected upwardly to increase the deflection of the spiral-shaped spring 362 upon engagement with a conductive ball 41, thereby increasing the biasing forces exerted against the conductive ball 41 and enhancing electrical contact therewith. For a preformed spiral-shaped spring 362 having a permanent upward deflection, the spiral-shaped spring 362 may be positioned directly over the upper surface 122 of the substrate 120 with no via subjacent thereto (see FIG. 9).

Figure 14:
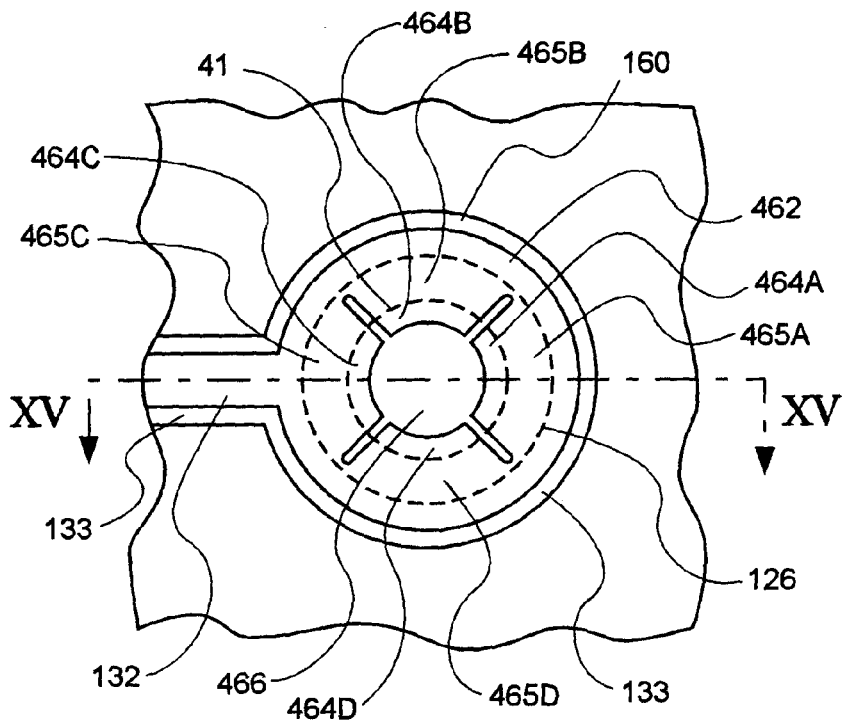
FIG. 14 shows a plan view of a substrate and a spring-biased electrical contact according to another alternative embodiment of the invention.
Figure 15:
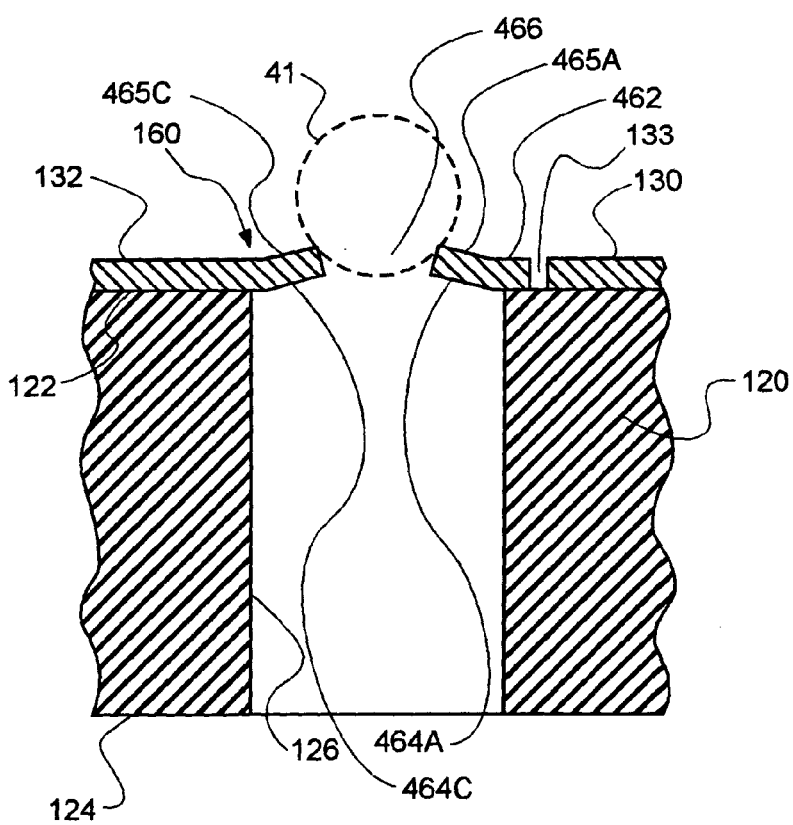
FIG. 15 shows a cross-sectional view of the substrate and spring-biased electrical contact as taken along line XV—XV of FIG. 14.

In a further embodiment of the present invention, as shown in FIGS. 14 and 15, a spring-biased electrical contact 160 may comprise a rosette spring 462 having a plurality of cantilevered pedals. For example, as shown in FIG. 14, the rosette spring 462 may include four cantilevered pedals 464a, 464b, 464c, 464d or any other suitable number of cantilevered pedals. Each of the cantilevered pedals 464a–d, respectively, includes a portion overlying and adhered to the upper surface 122 of the substrate 120 and another portion extending over a via 126 extending through the substrate 120. Each of the cantilevered pedals 464a–d also includes an upper surface 465a–d, respectively, for making physical and electrical contact with a conductive ball 41 (shown in dashed line in FIGS. 14 and 15) of the BGA package 10. Further, the cantilevered pedals 464a–d each terminate at a central opening 466, the central opening 466 serving to facilitate alignment a conductive ball 41 relative to the rosette spring 462.

The cantilevered pedals 464a–d, or a portion thereof, may be permanently upwardly deflected, as shown in FIG. 15, to increase the deflection of the cantilevered pedals 464a–d, respectively, upon engagement with a conductive ball 41, thereby increasing the biasing force exerted against the conductive ball 41 and enhancing electrical contact therewith. Such a rosette spring 462 preformed with permanently upwardly deflected pedals 464a–d may be positioned directly over the upper surface 122 of the substrate 120 with no underlying via (see FIG. 9). Also, the rosette spring 462 may be used in conjunction with a via 126 opening onto only the upper surface 122 of the substrate 120 (see FIG. 8). In a further alternative embodiment, the pedals 464a–d of the rosette spring 462 may be permanently downwardly deflected into the via 126. In this embodiment, the upper surfaces 465a–d of the cantilevered pedals 464a–d, respectively, may function to guide a conductive ball 41 toward the central opening 466, thereby facilitating alignment between the conductive ball 41 and the rosette spring 462.

Referring again to FIGS. 14 and 15, a cavity 133 formed in the layer of resilient conductive material 130 separates and electrically isolates the rosette spring 462 (as well as the associated conductive trace 132) from the remainder of the layer of resilient conductive material 130. Further, to facilitate the removal of oxides and contaminants from the exterior surface of a conductive ball 41, the rosette spring 462 may include cantilevered pedals 464a–d having a plurality of grooves 191 and ridges 192 (see FIG. 6), a plurality of barbs or protrusions 193 (see FIG. 8), and/or a roughened surface portion 194 (see FIG. 9) formed on their respective upper surfaces 465a–d, or a portion thereof.

Figure 16:
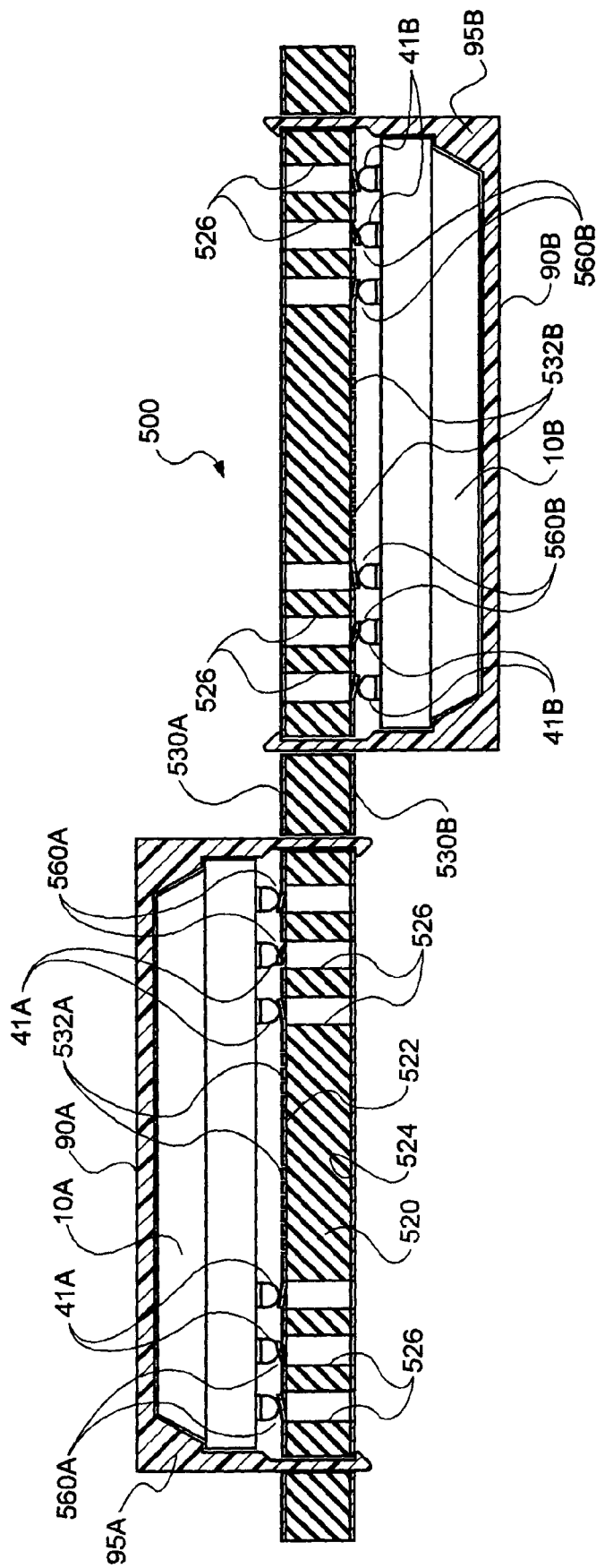
FIG. 16 shows a cross-sectional view of a multichip module incorporating a substrate and a plurality of spring-biased electrical contacts according to the invention.

Referring to FIG. 16, an MCM 500 incorporating a carrier substrate 520 and a plurality of spring-biased electrical contacts 560 according to the present invention is shown. One or more BGA packages 10a are mounted to an upper surface 522 of the carrier substrate 520 and one or more BGA packages 10b may be mounted to an opposing lower surface 524 of the carrier substrate 520 (again, the labels "upper" and "lower" being arbitrary). Although IC devices are shown mounted to both surfaces 522, 524 of the carrier substrate 520, those of ordinary skill in the art will understand that the MCM 500 may have IC devices mounted to only one of its carrier substrate surfaces 522, 524. Further, in addition to the BGA packages 10a, 10b mounted on the MCM carrier substrate 520, other electrical components and/or devices (not shown in FIG. 16) may also be mounted to the carrier substrate 520, as noted above.

Each of the upper and lower surfaces 522, 524 of the carrier substrate 520 includes a layer of resilient conductive material 530a, 530b, respectively, formed thereon. A plurality of conductive traces 532a are formed in the layer of resilient conductive material 530a on the substrate upper surface 522, and a plurality of conductive traces 532b are formed in the layer of resilient conductive material 530b on the substrate lower surface 524. At least some of the conductive traces 532a on the upper surface 522 of the substrate 520 terminate at spring-biased electrical contacts 560a. The spring-biased electrical contacts 560a on the upper surface 522 are arranged in one or more two-dimensional arrays corresponding to the pinout of the BGA package or packages 10a to be mounted thereon. Similarly, at least some of the conductive traces 532b on the lower surface 524 of the carrier substrate 520 terminate at spring-biased electrical contacts 560b. The spring-biased electrical contacts 560b on the lower surface 524 are arranged in one or more two-dimensional arrays corresponding to the pinout of the BGA package or packages 10b to be mounted thereon.

The spring-biased electrical contacts 560a, 560b may comprise cantilevered springs 162 (see FIGS. 3 through 9), transversely deflecting hoop-shaped springs 262 (see FIGS. 10 and 11), spiral-shaped springs 362 (see FIGS. 12 and 13), or rosette springs 462 (see FIGS. 14 and 15), or any suitable configuration or combination thereof. Also, the spring-biased electrical contacts 560a may each be preformed with a permanent deflection towards or away from the upper surface 522 of the substrate 520, and each spring-biased electrical contact 560a may extend over a via 526 opening to at least the upper surface 522 or, alternatively, be positioned directly over the upper surface 522 with no subjacent via. Similarly, the spring-biased electrical contacts 560b may each be preformed with a permanent deflection towards or away from the lower surface 524 of the carrier substrate 520, and each spring-biased electrical contact 560b may extend over a via 526 opening to at least the lower surface 524 or, alternatively, be positioned directly over the lower surface 524 with no underlying via.

To electrically connect the BGA packages 10a, 10b to the carrier substrate 520 of the MCM 500, each of the conductive balls 41a, 41b on the BGA packages 10a, 10b, respectively, is engaged with a mating spring-biased electrical contact 560a, 560b disposed on the MCM carrier substrate 520. Clamping elements 90a, 90b, which are shown in FIG. 16 as stab-in-place clips 95A, 95B, secure the BGA packages 10a, 10b, respectively, against the carrier substrate 520 to bias the conductive balls 41a, 41b against their mating spring-biased electrical contact 560a, 560b. The spring-biased electrical contacts 560a, 560b, each of which exhibits a deflection as a result of engagement with a conductive ball 41a, 41b, exert a biasing force against their mating conductive ball 41a, 41b and form physical and electrical contact therewith. To facilitate the removal of oxides and contaminants from the exterior surface of a conductive ball 41a, 41b and to enhance electrical contact therewith, the spring-biased electrical contacts 560a, 560b may each include a plurality of grooves 191 and ridges 192 (see FIG. 6), a plurality of barbs or protrusions 193 (see FIG. 8), and/or a roughened surface portion 194 (see FIG. 9) formed on a surface or a portion of a surface thereof.

Although the spring-biased electrical contacts or springs 160, 162, 262, 362, 462, 560a, 560b according to the present invention have been described herein in the context of establishing electrical connections with the conductive balls 41 of a conventional BGA package 10, it should be understood by those of ordinary skill in the art that the present invention is not so limited. The spring-biased electrical contacts or springs 160, 162, 262, 362, 462, 560a, 560b may be used to electrically connect the leads of other types of IC packages to a substrate, such as the substrate 120 of substrate assembly 100 or the carrier substrate 520 of MCM 500. For example, any of the spring-biased electrical contacts or springs 160, 162, 262, 362, 462, 560a, 560b incorporating any of the features described herein may be used to electrically connect the lead elements or lead fingers of an SOJ package or the lead elements or lead fingers of a TSOP to a substrate. Also, those of ordinary skill in the art will appreciate that the various features described herein (i.e., preformed deflections, via 126 extending through substrate 120, via 126 opening only to one surface of substrate 120, no subjacent via, and contact elements 191, 192, 193, 194, such as grooves, ridges, barbs, or roughened portions) may be incorporated in any suitable combination with any of the spring-biased electrical contacts or springs 160, 162, 262, 362, 462, 560a, 560b described herein.

Figure 17:
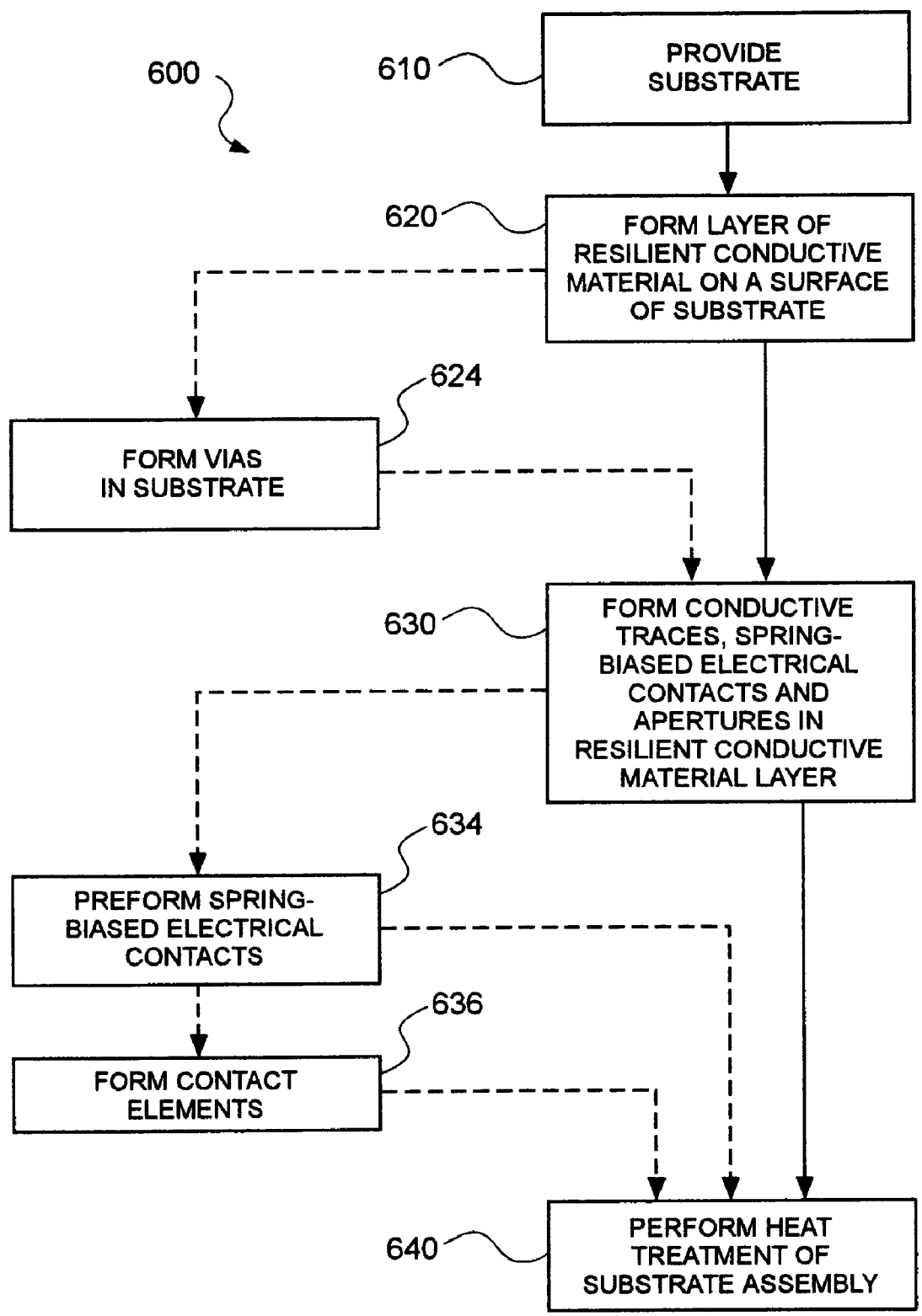
FIG. 17 shows a flow chart summarizing various embodiments of methods of fabricating a substrate assembly according to the present invention.

The present invention also encompasses methods of manufacturing a substrate assembly 100, or MCM 500, including substrates 120, 520 and spring-biased electrical contacts 160, 162, 262, 362, 462, 560a, 560b, as described above, according to the present invention. Referring to the flow chart of FIG. 17, from which the methods of the invention may be better understood, various embodiments of a sequence of acts or steps, generally denoted as 600, comprising various methods according to the present invention are shown. One embodiment of such a method begins with the act 610 of providing a substrate. The substrate may comprise an MCM carrier substrate, a burn-in board, or other test board, and the substrate may comprise any suitable material or combination of materials, including PCB materials, plastics, resins, composites, glasses, ceramics, and other oxide materials, as noted above. The substrate generally includes a first surface and an opposing, second surface.

Once a substrate has been provided, the act 620 of forming a layer of resilient conductive material on a surface of the substrate is performed. A layer of resilient conductive material may be applied to either one or both of the first and second surfaces of the substrate, and the layer of resilient conductive material may cover only a portion of the first surface and/or a portion of the second surface. The resilient conductive material may be any suitable material exhibiting sufficient electrical conductivity and suitable mechanical properties for the formation of spring-biased electrical contacts. A beryllium copper material is believed suitable for this purpose. It should be noted that the desired spring characteristics, as well as other mechanical properties, may be achieved by a heat treatment or other suitable processing, as will be described in greater detail below. Any suitable deposition process such as CVD or sputtering may be used to form the layer of resilient conductive material on a surface of the substrate, as noted above. Further, the layer of resilient conductive material may be a laminate that is secured or laminated onto a surface of the substrate using an adhesive and/or a thermocompression bonding process, also as noted above.

After the application of a layer of resilient conductive material to one or more of the surfaces of the substrate, the act 630 of forming conductive traces, spring-biased electrical contacts, and apertures in the resilient conductive material layer is performed. An etching process, laser ablation process, or any other suitable material removal process, as noted above, may be used to form the conductive traces, spring-biased electrical contacts, and apertures in the resilient conductive material layer. Also, a stamping process may be used to form the shapes of the spring-biased electrical contacts. The cavities defining the conductive traces, as well as the apertures surrounding the spring-biased electrical contacts, extend at least to the surface of the substrate and, optionally, may extend a depth into the substrate. The spring-biased electrical contacts may be configured in one or more two-dimensional arrays, each two-dimensional array corresponding to the pinout of an IC device to be mounted on the substrate. Also, the spring-biased electrical contacts may comprise any of the spring-biased electrical contacts described herein or a combination thereof.

Subsequent to the formation of conductive traces, spring-biased electrical contacts, and apertures in the layer of resilient conductive material on one or both of the opposing surfaces of the substrate, the substrate assembly is then subjected to a heat treatment process 640. Heat treating the substrate assembly after formation enables the realization of desired mechanical properties for the spring-biased electrical contacts while, at the same time, providing for suitable mechanical properties in the resilient conductive material layer during formation of the conductive traces, spring-biased electrical contacts, and apertures. For example, it may be desirable for the resilient conductive material layer to exhibit good ductility during the formation of the conductive traces and spring-biased electrical contacts; however, high ductility is generally undesirable for a spring, which should retain its shape. In contrast, it may be desirable for the spring-biased electrical contacts to exhibit high strength and sufficient elasticity, but high strength and elasticity may impede formation of the spring-biased electrical contacts, as well as the formation of other features in the resilient conductive material layer. In addition, a heat treatment may effect stress relief within the resilient conductive material layer, which may be especially beneficial if the spring-biased electrical contacts include preformed deflections.

In lieu of heat treatment, other known metallurgical treating processes may be employed to provide high strength and sufficient elasticity to the spring-biased electrical contacts. For example and not by way of limitation, air hardening, gas hardening or age hardening may be employed. Treatment of beryllium copper to enhance and modify certain physical characteristics thereof is known in the art, and Burch Engineered Materials, Inc. (formerly Brush Wellman) of Cleveland, Ohio offers technical assistance in this area. As used herein, the term "treatment" encompasses heat treating as well as other processes for modifying physical characteristics of the resilient conductive material or selected portions thereof.

Thus, the method of fabricating the substrate assembly and subsequently heat treating the substrate assembly provides for desired mechanical properties of the resilient conductive material during formation of the spring-biased electrical contacts and other features and also enables the realization of desired mechanical properties for the completed substrate assembly, such as desired spring characteristics for the spring-biased electrical contacts, as noted above. Essentially, the resilient conductive material layer or laminate applied to a surface of the substrate includes all necessary circuitry and electrical contacts for establishing electrical communication with any IC devices to be secured to the substrate, which circuitry and electrical contacts are formed in situ on the substrate. The above-described method stands in contrast to known methods of manufacturing spring-biased contacts for substrates and IC sockets, wherein the spring contacts are generally formed, subjected to a heat treatment, and then subsequently secured or inserted into the substrate or IC socket.

In an alternative embodiment of a method of manufacturing a substrate assembly according to the invention, the method proceeds as described above with respect to FIG. 17; however, the method further includes the act 624 of forming vias in the substrate. The apertures may open to only one surface or both surfaces of the substrate, and each of the vias is generally disposed subjacent a spring-biased electrical contact and is substantially concentric with the corresponding aperture formed in the layer of resilient conductive material, as noted above. The vias may be formed using any suitable process, including drilling, cutting, etching, laser cutting/ablation, water jet cutting/ablation, punching, or stamping. Also, it should be noted that it may be desirable to form vias subjacent a portion of the spring-biased electrical contacts on a surface of the substrate, while another portion of the spring-biased electrical contacts on that surface have no associated vias.

In another alternative embodiment of a method of manufacturing a substrate assembly according to the invention, the method proceeds according to either of the embodiments described above; however, the method further includes the act 634 of preforming the spring-biased electrical contacts, or a portion thereof. The spring-biased electrical contacts may be preformed to include a permanent deflection either toward or away from the underlying surface of the substrate, as noted above. Such deflection may be imparted to a spring-biased electrical contact by inserting a tool into the associated via and pulling or pushing on the spring-biased electrical contact until the contact exhibits the desired deflection.

In a further alternative embodiment of a method of manufacturing a substrate assembly according to the invention, the method proceeds according to any of the embodiments described above; however, the method further includes the act 636 of forming contact elements on the spring-biased electrical contacts or a portion thereof. The contact elements may comprise a plurality of alternating grooves or ridges, a plurality of barbs or protrusions, or a portion of roughened surface, as described above, or any other suitable contact elements known in the art.

If optional overlying dielectric layer 121 is employed in the substrate assembly of the present invention, it is desirably formed or applied over the layer of resilient conductive material after the formation of all traces, spring-biased electrical contacts and contact elements as previously described. If applied as a film over the layer of resilient conductive material, the overlying dielectric layer 121 may have preformed apertures 123 therein aligned with the spring-biased electrical contacts. If formed over the layer of resilient conductive material, the overlying dielectric material may be applied, for example, as a liquid, gel or paste and patterned and etched as known in the art to form apertures 123. Depending upon the dielectric material and etchant(s) chosen, apertures 123 may be formed either in substantially cylindrical shapes with an anisotropic etch or in frustoconical shapes using a substantially isotropic etch.

Substrates and spring-biased electrical contacts according to the present invention, as well as substrate assemblies incorporating the same, having been herein described, those of ordinary skill in the art will appreciate the many advantages of the present invention. One or more arrays of spring-biased electrical contacts and associated circuitry may be formed directly in a layer of resilient conductive material in situ on a surface of a substrate to form a substrate assembly. The spring-biased electrical contacts provide for the nonpermanent and direct attachment of IC devices to the substrate assembly, the spring-biased electrical contacts also compensating for nonplanarities in the substrate and IC devices. Fabrication of a substrate assembly according to the invention is achieved using optimum mechanical properties for formation (e.g., ductility), while the resulting substrate assembly exhibits optimum mechanical properties for performance (e.g., spring characteristics, high strength, elasticity, stress relief). Further, the methods of the present invention and resulting devices enable the direct and nonpermanent attachment of IC devices to a substrate on a production scale without the use of expensive IC sockets. In addition, while the present invention has been described in terms of nonpermanent attachment of IC devices to a substrate, those of ordinary skill in the art will understand and appreciate that long term attachment, including what might be termed "permanent" attachment of IC devices to a substrate may be effected using the present invention. Such permanent, yet removable attachment capability may be particularly desirable when repair or replacement of an IC device in long term service may be foreseen or contemplated.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the embodiments described herein, as well as alternative arrangements, may be devised by those skilled in the art without departing from the spirit of the present invention and the scope of the appended claims.

What is claimed is:

1. A method of fabricating a substrate assembly, comprising:
    providing a substrate having a first surface and an opposing second surface;
    forming a layer of resilient conductive material on at least one of the first and second surfaces of the substrate;
    forming a plurality of electrically isolated spring-biased electrical contacts from the layer of resilient conductive material;
    forming a plurality of elongate conductive traces from the layer of resilient conductive material, each elongate conductive trace associated with an electrically isolated spring-biased electrical contact of the plurality and extending therefrom, a portion of each elongate conductive trace being defined by a pair of substantially parallel cavities in the layer of resilient conductive material;
    deforming at least a portion of at least one electrically isolated spring-biased electrical contact of the plurality of electrically isolated spring-biased contacts from a position co-planar with the associated elongated conductive trace and adjacent the at least one of the first and second surfaces to another position extending away from the at least one of the first and second surfaces of the substrate; and
    treating the layer of resilient conductive material after forming the at least one electrically isolated spring-biased electrical contact to permanently enhance strength and elasticity of a portion of the resilient conductive material comprising the at least one electrically isolated spring-biased electrical contact.

2. The method of claim 1, wherein forming a layer of resilient conductive material on at least one of the first and second surface of the substrate comprises:
    providing a laminate sheet of the resilient conductive material; and
    bonding the laminate sheet to the at least one of the first and second surfaces of the substrate.

3. The method of claim 2, wherein bonding the laminate sheet to the at least one of the first and second surfaces of the substrate comprises adhering the laminate sheet to the at least one of the first and second surfaces of the substrate using an adhesive or bonding the laminate sheet to the at least one of the first and second surfaces of the substrate using a thermocompression bonding process.

4. The method of claim 1, wherein forming a layer of resilient conductive material on at least one of the first and second surfaces of the substrate comprises forming the layer of resilient conductive material on the at least one of the first and second surfaces of the substrate using a deposition process.

5. The method of claim 4, wherein the deposition process comprises chemical vapor deposition or sputtering.

6. The method of claim 1, further comprising forming at least one via in the substrate, the at least one via underlying the at least one electrically isolated spring-biased electrical contact.

7. The method of claim 6, wherein forming at least one via in the substrate further comprises forming a via opening only to the at least one of the first and second surfaces of the substrate.

8. The method of claim 1, further comprising forming at least one contact element on a surface of the at least one electrically isolated spring-biased electrical contact.

9. The method of claim 8, wherein forming at least one contact element further comprises forming a plurality of alternating grooves and ridges, forming at least one protrusion, or forming a roughened surface.

10. The method of claim 9, wherein forming a plurality of alternating grooves and ridges, forming at least one protrusion or forming a roughened surface is effected by etching.

11. The method of claim 1, wherein forming the plurality of electrically isolated spring-biased electrical contacts in the layer of resilient conductive material comprises at least one of forming a cantilevered spring, forming a transversely deflecting hoop-shaped spring, forming a spiral-shaped spring, or forming a rosette spring.

12. The method of claim 1, wherein forming the plurality of electrically isolated spring-biased electrical contacts and associated elongate conductive traces from the layer of resilient conductive material is effected by etching the layer of resilient conductive material.

13. The method of claim 1, further including disposing a dielectric layer overlying the layer of resilient conductive material, the dielectric layer being formed with at least one aperture therethrough substantially aligned with the at least one electrically isolated spring-biased electrical contact.

14. The method of claim 13, further comprising forming the dielectric layer to be of sufficient thickness to encompass at least a portion of each lead element of an integrated circuit device contacting the at least one electrically isolated spring-biased electrical contact.

15. The method of claim 13, further including forming the at least one aperture to be of frustoconical configuration.

16. The method of claim 13, further including preforming the dielectric layer with the at least one aperture prior to disposing the dielectric layer over the layer of resilient conductive material.

17. The method of claim 13, further including forming the dielectric layer in place over the layer of resilient conductive material and subsequently forming the at least one aperture therethrough.

* * * * *